United States Patent
Nguyen et al.

(10) Patent No.: US 11,270,761 B2
(45) Date of Patent: Mar. 8, 2022

(54) DUAL-MODE HIGH-BANDWIDTH SRAM WITH SELF-TIMED CLOCK CIRCUIT

(71) Applicant: Qualcomm Incorporated, San Diego, CA (US)

(72) Inventors: Hoan Huu Nguyen, Cary, NC (US); Francois Ibrahim Atallah, Raleigh, NC (US); Keith Alan Bowman, Morrisville, NC (US); Daniel Yingling, Apex, NC (US); Jihoon Jeong, Cary, NC (US); Yu Pu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 17/223,764

(22) Filed: Apr. 6, 2021

(65) Prior Publication Data
US 2021/0225435 A1 Jul. 22, 2021

Related U.S. Application Data

(62) Division of application No. 16/431,503, filed on Jun. 4, 2019, now Pat. No. 10,978,139.

(51) Int. Cl.
| | | |
|---|---|---|
| G11C 11/417 | (2006.01) | |
| G11C 7/06 | (2006.01) | |
| G11C 7/10 | (2006.01) | |
| G11C 7/22 | (2006.01) | |
| G11C 11/418 | (2006.01) | |
| G11C 11/419 | (2006.01) | |

(52) U.S. Cl.
CPC .............. *G11C 11/417* (2013.01); *G11C 7/06* (2013.01); *G11C 7/062* (2013.01); *G11C 7/1051* (2013.01); *G11C 7/1072* (2013.01); *G11C 7/22* (2013.01); *G11C 11/418* (2013.01); *G11C 11/419* (2013.01)

(58) Field of Classification Search
CPC ......... G11C 7/06; G11C 7/062; G11C 7/1051; G11C 7/1072; G11C 7/22; G11C 11/417; G11C 11/418; G11C 11/419
USPC .............................. 365/208, 189.02, 189.15
See application file for complete search history.

(56) References Cited

U.S. PATENT DOCUMENTS

| | | |
|---|---|---|
| 5,553,029 A | 9/1996 | Reohr et al. |
| 5,627,789 A | 5/1997 | Kalb, Jr. |
| 5,710,736 A | 1/1998 | Masuda et al. |
| 5,964,884 A | 10/1999 | Partovi et al. |

(Continued)

FOREIGN PATENT DOCUMENTS

WO WO-2017149295 A1 9/2017

OTHER PUBLICATIONS

International Search Report and Written Opinion—PCT/US2020/035937—ISA/EPO—dated Feb. 2, 2021.

*Primary Examiner* — Son L Mai
(74) *Attorney, Agent, or Firm* — Qualcomm Incorporated

(57) ABSTRACT

A dual-mode memory is provided that includes a self-timed clock circuit for asserting a sense enable signal for a sense amplifier. In a low-bandwidth read mode, the self-timed clock circuit asserts the sense enable signal only once during a memory clock cycle. The sense amplifier then senses only a single bit from a group of multiplexed columns. In a high-bandwidth read mode, the self-timed clock circuit successively asserts the sense enable signal so that the sense amplifier successively senses bits from the multiplexed columns.

9 Claims, 5 Drawing Sheets

(56) References Cited

U.S. PATENT DOCUMENTS

| | | |
|---|---|---|
| 6,282,133 B1 * | 8/2001 | Nakagawa ............... G11C 7/06 |
| | | 365/154 |
| 6,327,203 B1 | 12/2001 | Won |
| 6,473,349 B1 | 10/2002 | Flannagan |
| 7,355,907 B2 | 4/2008 | Chen et al. |
| 7,460,432 B2 | 12/2008 | Warner |
| 7,643,330 B1 | 1/2010 | Lin et al. |
| 7,746,716 B2 | 6/2010 | Jetton et al. |
| 8,295,110 B2 | 10/2012 | Sutardja et al. |
| 8,913,420 B2 | 12/2014 | Yanni |
| 9,406,375 B1 | 8/2016 | Barowski et al. |
| 9,490,760 B2 | 11/2016 | Wang et al. |
| 9,734,896 B2 | 8/2017 | Roine et al. |
| 2010/0039870 A1 | 2/2010 | Murakami |
| 2014/0185364 A1 | 7/2014 | Iyer et al. |
| 2015/0003148 A1 | 1/2015 | Iyer et al. |
| 2019/0096477 A1 | 3/2019 | Clinton |
| 2020/0388327 A1 | 12/2020 | Nguyen et al. |

* cited by examiner

US 11,270,761 B2

DUAL-MODE HIGH-BANDWIDTH SRAM WITH SELF-TIMED CLOCK CIRCUIT

CLAIM OF PRIORITY UNDER 35 U.S.C. § 120

The present Application for Patent is a Divisional Application of Patent application Ser. No. 16/431,503, entitled "DUAL-MODE HIGH-BANDWIDTH SRAM WITH SELF-TIMED CLOCK CIRCUIT" filed Jun. 4, 2019, pending, and assigned to the assignee hereof and hereby expressly incorporated by reference herein.

TECHNICAL FIELD

This application relates to memories, and more particularly to a dual-mode high-bandwidth static random access memory (SRAM) with a self-timed clock circuit for both low bandwidth and high bandwidth operation.

BACKGROUND

In a conventional SRAM, a read operation occurs responsive to a memory clock cycle. To read a word from the memory, an addressed word line is asserted during an initial portion of the memory clock cycle. The asserted word line switches on the access transistors for the bit cells in the addressed row. With its access transistors switched on, each bit cell develops a voltage difference across the bit line pair in the column including the bit cell. From this voltage difference, a sense amplifier makes a bit decision. But the voltage difference is not full rail so the sense amplifier needs gain to complete the bit decision. As a result, the sense amplifier is relatively large compared to each bit cell such that it would lower density if each column of bit cells had its own sense amplifier.

It is thus conventional for a group of columns to be multiplexed onto a single sense amplifier through a column multiplexer. The bit decision from the sense amplifier is then latched in an output data latch to complete the memory read operation. The bits in the various output data latches form a word that is retrieved from the row addressed by the word line. To read another word requires another memory clock cycle.

Each memory clock cycle requires a pre-charging of the bit lines prior to the assertion of the word line. Although such operation is conventional, note that all the columns in a group of multiplexed columns are developing a voltage difference on their bit line pairs when the word line is asserted. A high-bandwidth SRAM has thus been developed that exploits the access to the remaining columns such that more than one bit cell is read per memory cycle. For example, the sense amplifier makes a bit decision for a bit cell for a first column during an initial portion of the memory cycle. Then the sense amplifier makes another bit decision for a bit cell for a second column in the same multiplexed group of columns during a remaining portion of the memory cycle.

A conventional SRAM is thus a low-bandwidth SRAM as compared to a high-bandwidth SRAM. But it complicates circuit design to accommodate both low-bandwidth and high-bandwidth SRAM applications.

SUMMARY

A dual-mode memory is disclosed that includes: a first group of columns, each column in the first group of columns including a bit line pair; a first column multiplexer configured to select from the columns in the first group of columns to provide a first selected bit line pair; a first sense amplifier configured to respond to an assertion of a sense enable signal to sense a bit decision from a voltage difference for the first selected bit line pair; and a self-timed clock circuit configured in a low-bandwidth read mode to assert the sense enable signal once during a memory clock cycle and configured in a high-bandwidth read mode to assert the sense enable signal at least twice during the memory clock cycle.

In addition, a method is disclosed that includes the acts of: responsive to a first value for a dual-mode control signal, pulsing a sense enable signal for a first time to trigger a first sense amplifier to sense a first bit from a first group of multiplexed columns in the memory during a first memory clock cycle, wherein the sense enable signal is not further pulsed during the first memory clock cycle; responsive to a second value for the control signal, pulsing the sense enable signal for a second time to trigger the first sense amplifier to read a second bit from a second group of multiplexed columns in the memory during a second memory clock cycle; and responsive to the second value for the control signal, pulsing the sense enable signal for a third time to trigger the first sense amplifier to read a third bit from the second group of multiplexed columns during the second memory clock cycle.

Finally, a dual-mode memory is disclosed that includes: a first set-reset (SR) latch configured to set responsive to an initiation of a current memory clock cycle to assert a first latch output signal, wherein the first SR latch is further configured to reset responsive to an assertion of a first reset signal to de-assert the first latch output signal; a delay circuit configured to assert the first reset signal following an expiration of a slow delay after the assertion of the first latch output signal during a low-bandwidth read mode of operation for the memory and configured to assert the first reset signal following an expiration of a fast delay after the assertion of the first latch output signal during a high-bandwidth read mode of operation for the memory, wherein the fast delay is shorter than the slow delay; a second SR latch configured to set responsive to the reset of the first latch during the high-bandwidth read mode of operation to assert a second latch output signal; and a logic gate configured to assert a sense enable signal responsive to the assertion of the first latch output signal or the second latch output signal.

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A dual-mode memory is disclosed that can operate in both a low-bandwidth read mode and also in a high-bandwidth read mode. In the low-bandwidth read mode, the dual-mode memory reads one bit per memory clock cycle from each accessed group of multiplexed columns. In the high-bandwidth read mode, the dual-mode memory reads in one memory clock cycle at least a first bit and a second bit from each group of columns. In some embodiments, the dual-mode memory may read more than two bits per memory clock cycle from each group of columns during the high-bandwidth read mode.

A sense amplifier for each group of columns forms a bit decision during a read operation responsive to a sense enable signal. A self-timed clock circuit is provided for the pulsing of the sense enable signal. During the low-bandwidth read mode, the self-timed clock circuit asserts the sense enable signal to a power supply voltage once per memory clock cycle during a read operation. The sense enable signal is thus pulsed only once per memory clock cycle during the low-bandwidth read mode. The bit lines are then pre-charged for a read operation in a following memory clock cycle. But during the high-bandwidth read mode, the self-timed clock circuit asserts the sense enable signal multiple times per memory clock cycle during a read operation. Each time the sense enable signal is pulsed, a bit is read from each group of columns. In contrast to the low-bandwidth read mode, the bit lines are not pre-charged between successive reads in the same memory clock cycle during the high-bandwidth read mode. In this fashion, not only is speed (bandwidth) increased during the high-bandwidth read mode but power is also conserved.

Figure 1A:
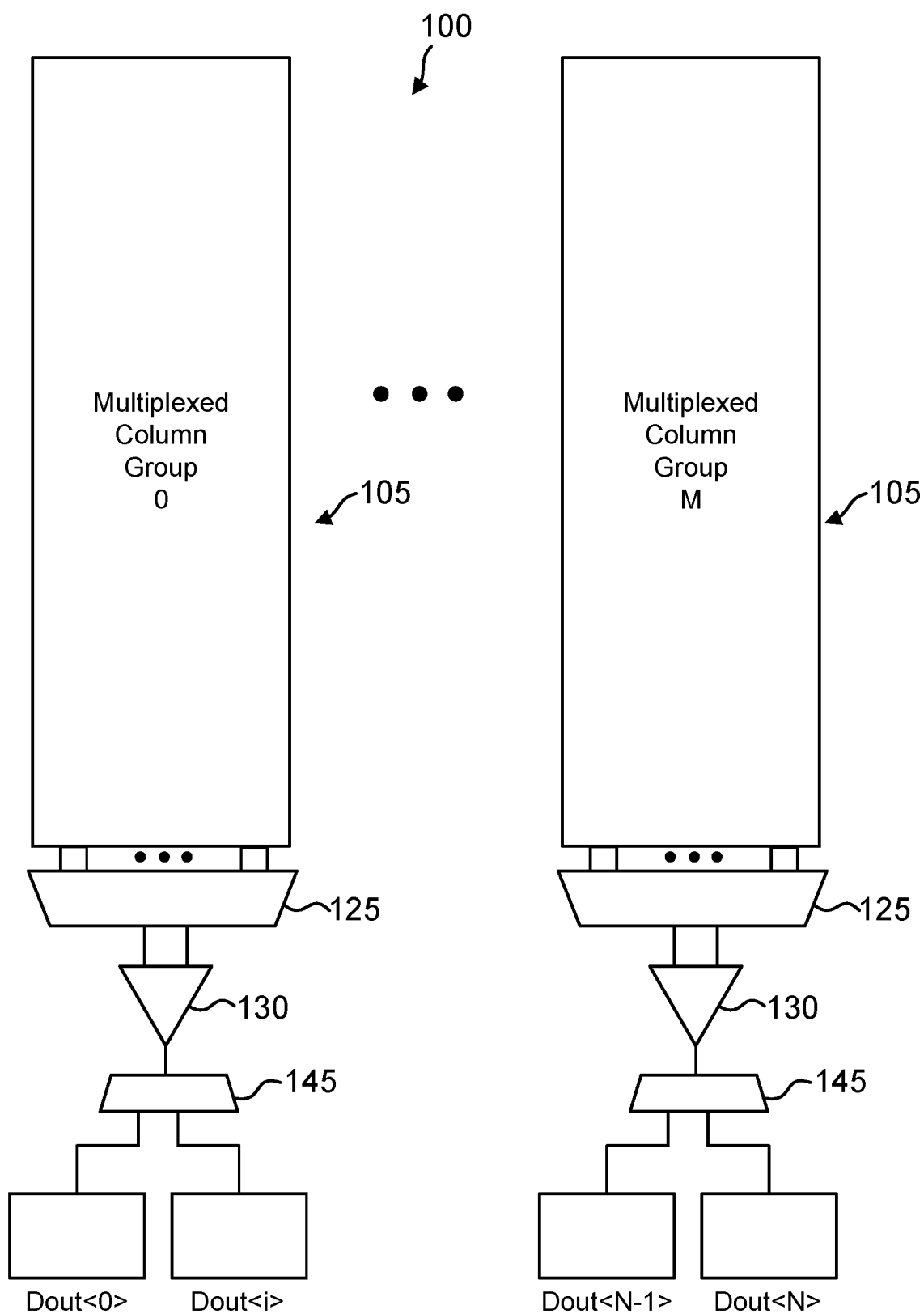
FIG. 1A is a diagram of a dual-mode memory in which two bits are read from each multiplexed group of columns during a high-bandwidth read mode in a single memory clock cycle and in which a single bit is read from each multiplexed group of columns during a low-bandwidth read mode in a single memory clock cycle in accordance with an aspect of the disclosure.
Figure 1B:
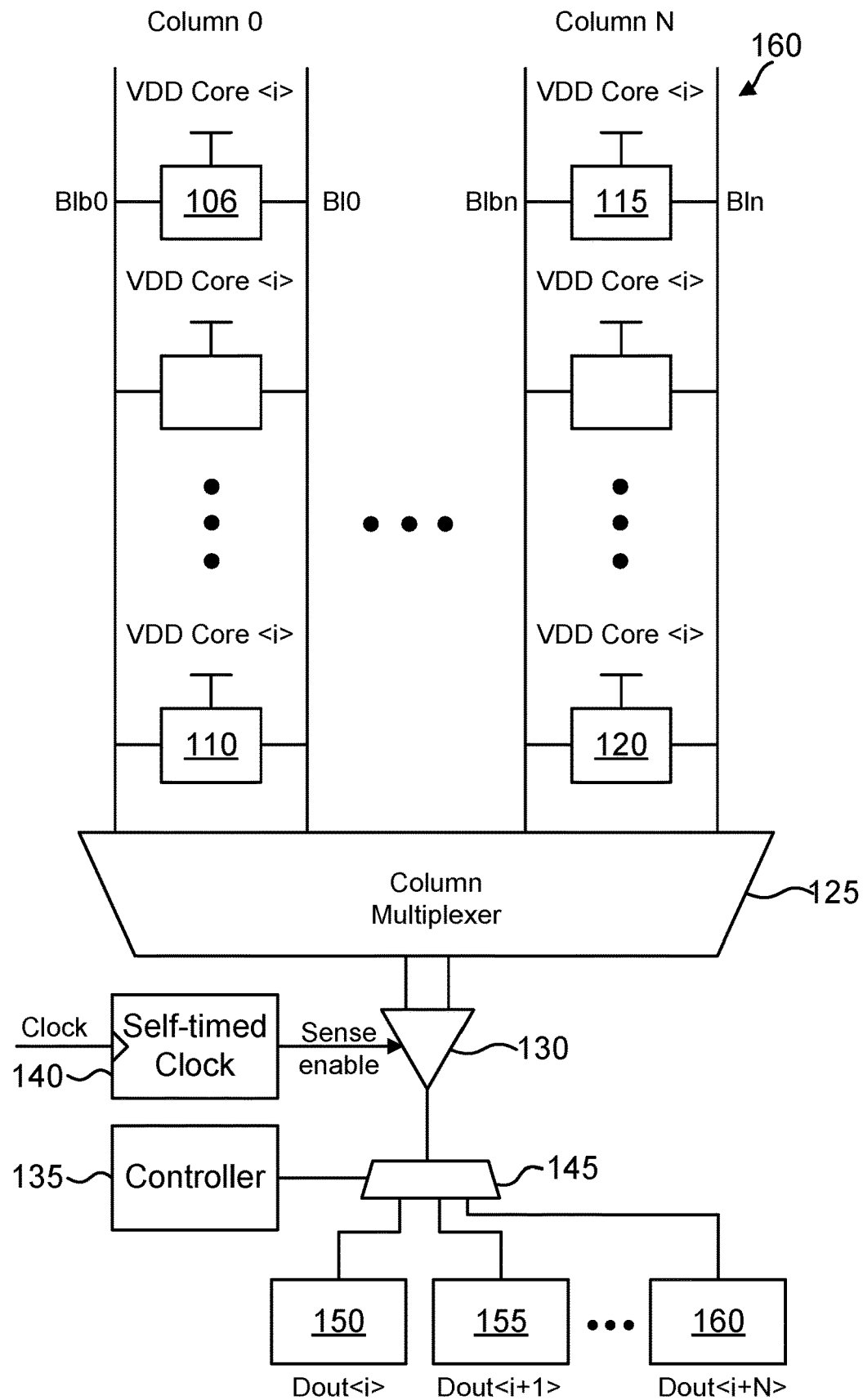
FIG. 1B illustrates another embodiment for a multiplexed group of columns in which more than two bits are read from the multiplexed group of columns during the high-bandwidth read mode in a single memory clock cycle in accordance with an aspect of the disclosure.

Turning now to the drawings, an example dual-mode memory 100 is shown in FIG. 1A. Dual-mode memory 100 includes a plurality of column groups 105 ranging from zeroth (Group 0) column group to an Mth (Group N) column group. An example column group 160 is shown in more detail in FIG. 1B. A plurality of columns are multiplexed through a column multiplexer 125 in column group 160, ranging from a zeroth column (Column 0) to an Nth column (Column N). Each column includes a bit cell at an intersection of a word line with the column (the word lines are not shown for illustration clarity). For example, a bit cell 105 in column 0 and a bit cell 115 in column N correspond to the intersection of the respective column and a zeroth word line. Similarly, a bit cell 110 in column 0 and a bit cell 120 in column N correspond to the intersection of the respective column and a final word line. Each word line thus corresponds to a row of bit cells. Each column includes a pair of bit lines. A true bit line B10 and a complement bit line BM form the bit line pair in column 0. Similarly, a true bit line Bln and a complement bit line Blbn form the bit line pair in column N. Each bit cell couples to its column's bit line pair through a pair of access transistors (not illustrated) when the word line for the bit cell's row is asserted.

Depending upon the binary content of the accessed bit cell, a voltage difference develops across the bit line pair for the bit cell's column. A sense amplifier 130 forms a bit decision from this voltage difference for a column as selected through column multiplexer 125. This column selection is responsive to a column address. Sense amplifier 130 senses the bit decision as triggered by a sense enable signal from a self-timed clock circuit 140. In turn, self-timed clock circuit 140 is triggered to assert the sense enable signal responsive to a clock edge of a memory clock signal (Clock). The number of times that self-timed clock circuit 140 asserts the sense enable signal depends upon whether the low-bandwidth read mode is active or whether the high-bandwidth read mode is active. Prior to a current memory clock cycle, a bit line pre-charge circuit (not illustrated) pre-charges the bit line pairs for the various columns to a core power supply voltage. In the low-bandwidth read mode of operation, the current memory clock cycle triggers self-timed clock circuit 140 to assert the sense enable signal only once during the current memory clock cycle. However, in the high-bandwidth read mode of operation, the current memory clock cycle triggers self-timed clock circuit 140 to assert the sense enable signal more than once during the current memory clock cycle. Each time the sense enable signal is asserted in the high-bandwidth read mode of operation, a bit is sensed by sense amplifier 130. The bit lines are not pre-charged in the high-bandwidth read mode of operation between successive reads in the current memory clock cycle.

The number of times the sense enable is asserted in a single memory clock cycle during the high-bandwidth read mode (and hence the number of bits that are read in a single memory clock cycle) depends upon the embodiment. For example, two bits can be read from each column group 105 in dual-mode memory 100 of FIG. 1A. These multiple bits are demultiplexed by a demultiplexer 145 to corresponding output data latches. For example, demultiplexer 145 in column group 0 drives an output data latch Dout<0> and an output data latch Dout<1>. Similarly, demultiplexer 145 in multiplexed column group M drives an output data latch Dout <N−1> and an output data latch Dout<N+1>. Each column group 105 in dual-mode memory 100 can thus read two bits per memory clock cycle during the high-bandwidth read mode. Such operation may also be designated herein as "double-pumped" in that sense amplifiers 130 are triggered twice per memory clock cycle in the high-bandwidth read mode.

But it will be appreciated that more than two columns may be read from in one memory clock cycle for each column group depending upon the embodiment. For example, column group 160 includes a plurality of (N+1) columns. Depending upon the memory clock rate, a bit may be read from each of these N+1 columns in each column group 160. Demultiplexer 145 for column group 160 can thus demultiplex the bit decisions from the corresponding sense amplifier 130 across a plurality of (N+1) output data latches. Column group 160 is the ith column group in a dual-mode memory including column group 160. Its output data latches thus range from an ith output data latch Dout<i> to an Nth output data latch Dout<i+N>. A controller 135 controls demultiplexer 145 in each multiplexed column group.

Figure 2:
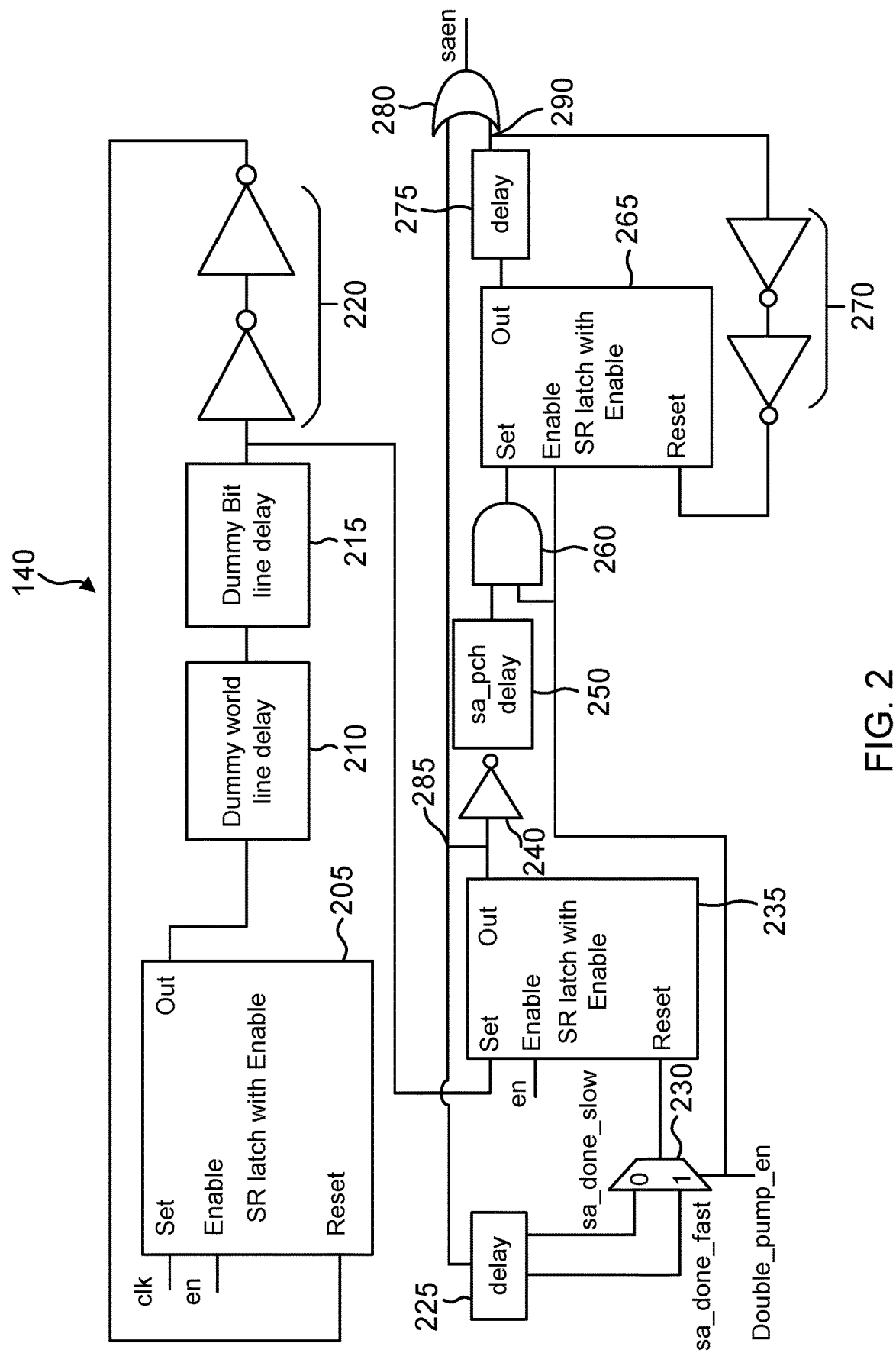
FIG. 2 illustrates a self-timed clock circuit for asserting a sense enable signal for the dual-mode memory of FIG. 1A.

Self-timed clock circuit 140 is shown in more detail in FIG. 2. To respond to the memory clock signal (clk), self-timed clock circuit 140 includes a first set-reset (SR) latch 205 that is set during a current memory clock cycle as discussed further herein. When set, first SR latch 205 asserts a first latch output signal 285 that is received by an OR gate 280. OR gate 280 asserts the sense enable signal (designated as saen in FIG. 2) in response to the assertion of first latch output signal 285.

First SR latch 235 is reset responsive to a delay circuit 225. Delay circuit 225 begins timing its delay responsive to the assertion of first latch output signal 285. When the delay is completed, delay circuit 225 resets first SR latch 235. The delay timed by delay circuit 225 depends upon whether it is the high-bandwidth read mode or the low-bandwidth read mode that is active. In the high-bandwidth read mode, delay circuit 225 resets first SR latch 235 after the expiration of a relatively short delay (sa_done_fast). In the low-bandwidth read mode, delay circuit 225 resets first SR latch 235 after the expiration of a long delay (sa_done_slow) that is longer than the short delay. In one embodiment, delay circuit 225 may time both delays simultaneously when triggered by first latch output signal 285. A multiplexer 230 selects between the two delays responsive to a dual-mode control signal (Double_pump_en). Alternatively, delay circuit 225 may respond directly to the dual-mode control signal so as to time the appropriate delay. In such an embodiment, there would be no need for multiplexer 230.

The dual-mode control signal drives an enable input for a second SR latch 265 to enable second SR latch 265 during the high-bandwidth read mode. During the low-bandwidth mode, second SR latch 265 is disabled. First SR latch 235 has a similar enable input to respond to a read enable signal (en) that is asserted during both the low-bandwidth read mode and the high-bandwidth read mode.

The setting and resetting of first SR latch 235 controls the sense enable signal assertion for the reading of a first bit from a selected column in each group of columns during double-pumped operation for dual-mode memory 100 (FIG. 1A). For example, a bit decision from sense amplifier 130 for the zeroth multiplexed group of columns may be demultiplexed through its demultiplexer 145 to be latched in the Dout<0> output data latch. Similarly, a bit decision from sense amplifier 130 for the Mth multiplexed group of columns may be demultiplexed through its demultiplexer 135 to be latched in a Dout<N−1> output data latch.

The setting and resetting of second SR latch 265 controls the reading of a second bit from another selected column in each group of columns during double-pumped operation for dual-mode memory 100. A resulting second bit decision from sense amplifier 130 for the zeroth multiplexed group of columns may then be demultiplexed through the corresponding demultiplexer 135 to be latched in a Dout <1> output data latch. Similarly, a second bit decision from sense amplifier 130 for the Mth multiplexed group of columns may also be demultiplexed through its demultiplexer 145 to be latched in Dout<N+1> data output latch.

To control the setting and resetting of second SR latch 265 during the high-bandwidth read mode, an inverter 240 inverts first latch output signal 285. Thus, the output of inverter 240 will be asserted in response to the reset of first latch output signal 285 following the read of the first bit for each multiplexed group of columns. The assertion of the output of inverter 240 triggers a dummy sense amplifier pre-charge delay circuit 250 to time a dummy pre-charge delay period (sa_pch delay) that models the delay necessary following the reading of the first bit (the "first pump" in double-pumped operation) for the pre-charging of sense amplifiers 130. Once the dummy pre-charge delay period expires, dummy sense amplifier pre-charge delay circuit 250 asserts an output to an AND gate 260 that also ANDs the dual-mode control signal. The output of AND gate 260 will thus be asserted following the expiration of the dummy pre-charge delay period during the high-bandwidth read mode.

The assertion of the AND gate output signal sets second SR latch 265 so that a second latch output signal 290 is asserted. In some embodiments, a delay circuit 275 may delay second latch output signal 290. OR gate 280 also receives second latch output signal 290 so that the sense enable signal is asserted for the second time during a single memory clock cycle in the high-bandwidth read mode (the second pump in double-pumped operation). A set of inverters 270 delays second latch output signal 290 to reset second SR latch 265.

First SR latch 235 is set regardless of whether it is the high-bandwidth read mode of the low-bandwidth read that is active. But the resulting first assertion of the sense enable signal should not occur until the word line development delay is completed followed by a completion of the bit line development delay. The word line development delay corresponds to the delay between the triggering edge of the current memory clock cycle (e.g., the rising edge) and the assertion of the word line voltage. The assertion of the word line voltage then allows the accessed bit cells to develop their voltage difference across the corresponding bit line pairs. The bit line development delay is the delay between the assertion of the word line development and the development of the voltage differences on the bit line pairs.

To account for these delays, self-timed clock circuit 140 may include a third SR latch 205 that is set responsive to the rising edge of the memory clock signal when enabled by the read enable signal (en). In response to being set by the memory clock signal rising edge, third SR latch 205 asserts an output signal (Out) to trigger a dummy word line delay circuit 210. Dummy word line delay circuit 210 times a dummy word line development delay that models the word line development delay. After this delay, dummy word line circuit 210 triggers a dummy bit line delay circuit 215. Dummy bit line delay circuit 215 times a dummy bit line that models the bit line development delay.

As noted earlier, the bit line pairs are pre-charged to the core power supply voltage prior to the current memory clock cycle. Depending upon the read address, a row decoder (not illustrated) will then assert the word line for an accessed row of bit cells. Depending upon its stored binary content, each accessed bit cell will then either discharge either the true bit line or the complement bit line slightly from its pre-charge state. Note that the bit line pairs for all the columns in column groups 105 and 160 will then develop their voltage difference. The high-bandwidth read mode exploits this simultaneous development of the voltage differences across all the columns through the successive reads in one memory clock cycle.

Once dummy bit line delay circuit 215 has completed the bit line development delay period, dummy bit line delay circuit 215 triggers a series of inverters 220 to reset third SR latch 205. At the same time dummy bit line delay circuit 215 triggers inverters 220, it sets first SR latch 235.

Figure 3:
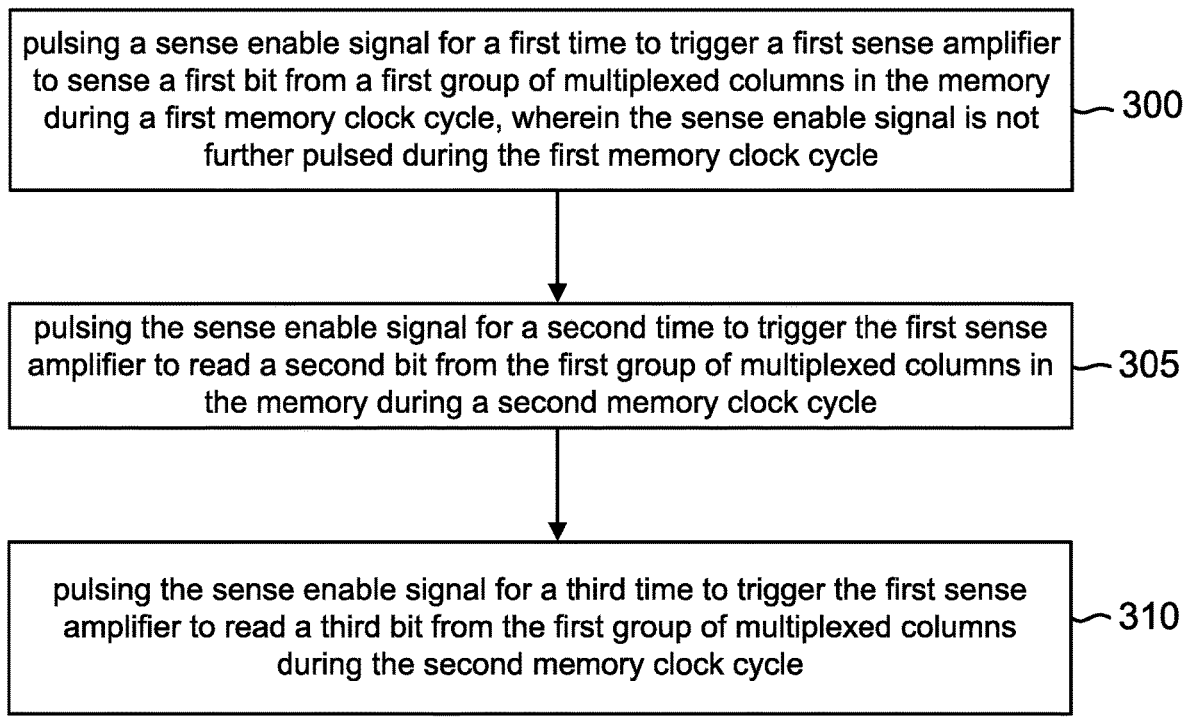
FIG. 3 is a flowchart for an example method of operation for a dual-mode memory in accordance with an aspect of the disclosure.

A method of operation for a dual-mode memory will now be discussed with regard to the flowchart of FIG. 3. The method includes an act 300 that is responsive to a first value for a dual-mode control signal and includes pulsing a sense enable signal for a first time to trigger a first sense amplifier to sense a first bit from a first group of multiplexed columns in the memory during a first memory clock cycle, wherein the sense enable signal is not further pulsed during the first memory clock cycle. The pulsing of the sense enable signal by first SR latch 235 during the low-bandwidth read mode of operation is an example of act 300. The method further includes an act 305 that responsive to a second value for the control signal and includes pulsing the sense enable signal for a second time to trigger the first sense amplifier to read a second bit from a second group of multiplexed columns in the memory during a second memory clock cycle. The pulsing of sense enable signal by first SR latch 235 during the high-bandwidth read mode of operation is an example of act 305. Finally, the method includes an act 310 that is also responsive to the second value for the control signal and includes pulsing the sense enable signal for a third time to trigger the first sense amplifier to read a third bit from the second group of multiplexed columns during the second memory clock cycle. The pulsing of the sense enable signal by second SR latch 265 is an example of act 310.

Figure 4:
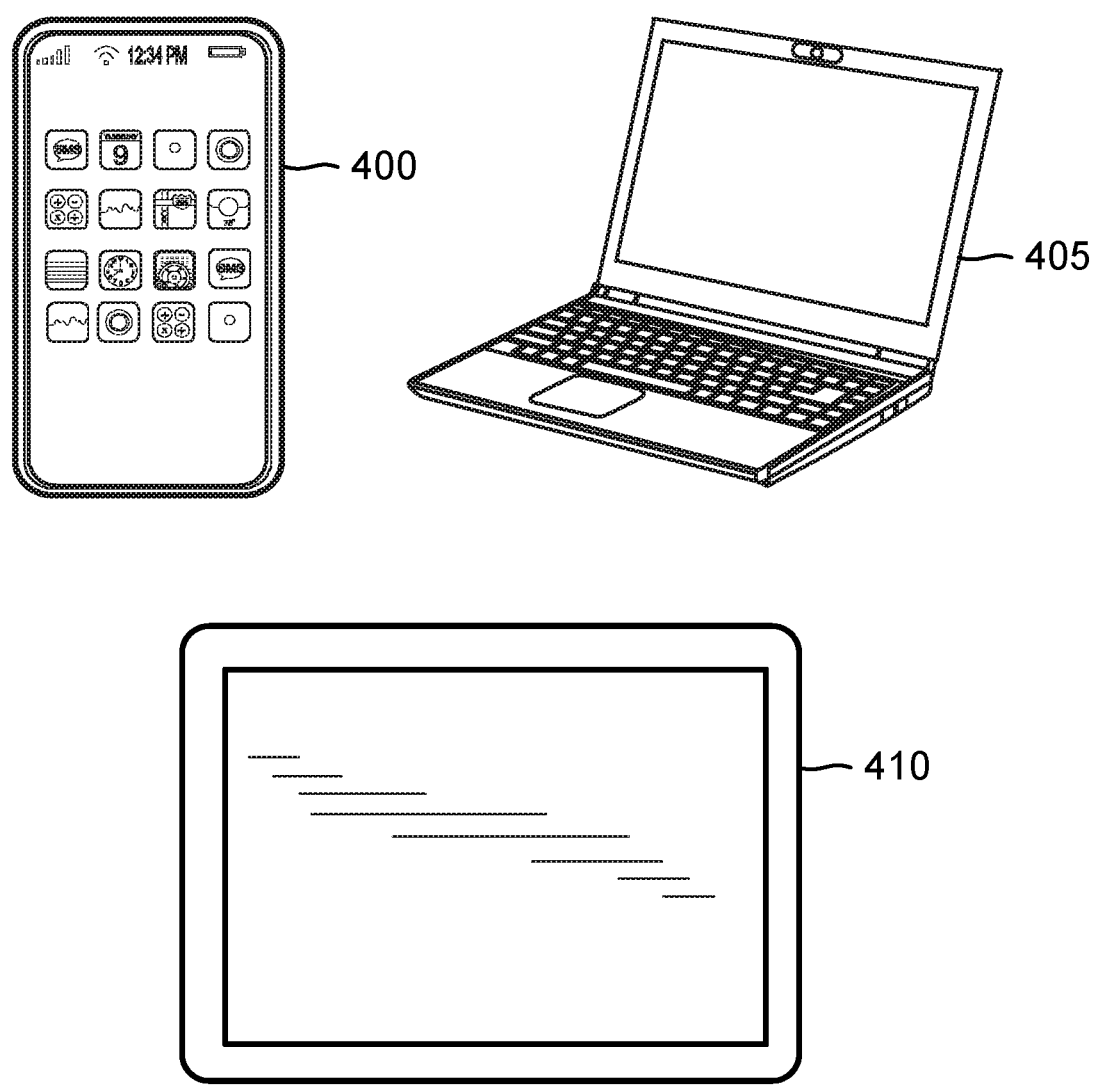
FIG. 4 illustrates some example systems incorporating a dual-mode memory as disclosed herein.

A dual-memory as disclosed herein may be incorporated into a wide variety of electronic systems. For example, as shown in FIG. 4, a cell phone 400, a laptop 405, and a tablet PC 410 may all include a dual-mode memory in accordance with the disclosure. Other exemplary electronic systems such as a music player, a video player, a communication device, and a personal computer may also be configured with memories constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A dual-mode memory, comprising:
   a first set-reset (SR) latch configured to set responsive to an initiation of a current memory clock cycle to assert a first latch output signal, wherein the first SR latch is further configured to reset responsive to an assertion of a first reset signal to de-assert the first latch output signal;
   a delay circuit configured to assert the first reset signal following an expiration of a slow delay after the assertion of the first latch output signal during a low-bandwidth read mode of operation for the memory and configured to assert the first reset signal following an expiration of a fast delay after the assertion of the first latch output signal during a high-bandwidth read mode of operation for the memory, wherein the fast delay is shorter than the slow delay;
   a second SR latch configured to set responsive to the reset of the first latch during the high-bandwidth read mode of operation to assert a second latch output signal;
   and a logic gate configured to assert a sense enable signal responsive to the assertion of the first latch output signal or the second latch output signal.

2. The dual-mode memory of claim 1, wherein the logic gate comprises an OR gate.

3. The dual-mode memory of claim 1, further comprising:
   a third SR latch configured to set responsive to the initiation of the current memory clock cycle to assert a third latch output signal, wherein the first SR latch is configured to set responsive to the assertion of the third latch output signal.

4. The dual-mode memory of claim 3, further comprising:
   a dummy word line delay circuit configured to time a dummy word line development delay responsive to the assertion of the third latch output signal; and
   a dummy bit line delay circuit configured to model a bit line development delay responsive to an expiration of the dummy word line development delay, wherein the first SR latch is further configured to set responsive to an expiration of the bit line development delay.

5. The dual-mode memory of claim 4, further comprising a first series of inverters configured to reset the third SR latch responsive to the expiration of the bit line development delay.

6. The dual-mode memory of claim 1, further comprising:
   a group of columns, each column in the group of columns including a bit line pair;
   a column multiplexer configured to select from the group of columns responsive to a first column address to provide a selected bit line pair; and
   a sense amplifier configured to respond to the assertion of the sense enable signal to sense a bit decision from a voltage difference for the selected bit line pair.

7. The dual-mode memory of claim 1, further comprising:
   a dummy sense amplifier pre-charge delay circuit configured to time a dummy sense amplifier pre-charge delay responsive to the reset of the first SR latch.

8. The dual-mode memory of claim 7, wherein the second SR latch is further configured to set responsive to an expiration of the dummy sense amplifier pre-charge delay.

9. The dual-mode memory of claim 1, wherein the second SR latch is configured to be enabled only during the high-bandwidth read mode.

* * * * *